United States Patent
Rong

(10) Patent No.: US 12,149,446 B2
(45) Date of Patent: Nov. 19, 2024

(54) MESSAGE MATCHING TABLE LOOKUP METHOD, SYSTEM, STORAGE MEDIUM, AND TERMINAL

(71) Applicant: SANECHIPS TECHNOLOGY CO., LTD., Shenzhen (CN)

(72) Inventor: Lifeng Rong, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 395 days.

(21) Appl. No.: 17/613,793

(22) PCT Filed: Apr. 13, 2020

(86) PCT No.: PCT/CN2020/084405
§ 371 (c)(1),
(2) Date: Nov. 23, 2021

(87) PCT Pub. No.: WO2020/248690
PCT Pub. Date: Dec. 17, 2020

(65) Prior Publication Data
US 2022/0231945 A1    Jul. 21, 2022

(30) Foreign Application Priority Data
Jun. 14, 2019    (CN) .......................... 201910517975.4

(51) Int. Cl.
*H04L 45/745*    (2022.01)
(52) U.S. Cl.
CPC .................................. *H04L 45/745* (2013.01)
(58) Field of Classification Search
CPC .................................................... H04L 45/745
See application file for complete search history.

(56) References Cited

U.S. PATENT DOCUMENTS 9,262,312 B1 * 2/2016 Gazit ................ H04L 45/74591
2010/0205364 A1 8/2010 Gazit
(Continued)

FOREIGN PATENT DOCUMENTS

CN    1809054 A    7/2006
CN    101252534 A    8/2008
(Continued)

OTHER PUBLICATIONS

International Searching Authority. International Search Report and Written Opinion for PCT Application No. PCT/CN2020/084405 and English translation, mailed May 26, 2020, pp. 1-10.
(Continued)

*Primary Examiner* — Kevin M Cunningham
(74) *Attorney, Agent, or Firm* — Vivacqua Crane, PLLC

(57) ABSTRACT

Disclosed are a method for message match table lookup, a system, a non-transitory computer-readable storage medium and a terminal. The method for message match table lookup includes: performing on-demand data bit width compression on information of a specified part of an input message; extracting N groups of data from compressed data, performing intra-group data comparison to obtain N groups of comparison results, and performing true value splicing on the N groups of comparison results, where N is an integer greater than 1; performing match searching of a ternary content addressable memory (TCAM) by using the true value splicing result as a keyword; and searching, according to a match hit result of the TCAM, for an Action Random Access Memory (Action RAM), and outputting, by the Action RAM, a table lookup request.

5 Claims, 3 Drawing Sheets

(56) References Cited

U.S. PATENT DOCUMENTS

| | | | |
|---|---|---|---|
| 2012/0096220 | A1 | 4/2012 | Liu et al. |
| 2013/0246697 | A1 | 9/2013 | Estan et al. |
| 2013/0246698 | A1 | 9/2013 | Estan et al. |
| 2013/0304983 | A1 | 11/2013 | Koktan |
| 2014/0286226 | A1* | 9/2014 | Seok .................... H04W 56/00 370/312 |
| 2015/0326480 | A1 | 11/2015 | Dolganow et al. |
| 2016/0283316 | A1 | 9/2016 | Abali et al. |
| 2017/0346765 | A1 | 11/2017 | Immidi |

FOREIGN PATENT DOCUMENTS

| | | |
|---|---|---|
| CN | 101350771 A | 1/2009 |
| CN | 102291301 A | 12/2011 |
| CN | 102377664 A | 3/2012 |
| CN | 103117931 B | 7/2015 |
| CN | 104866502 A | 8/2015 |
| CN | 107967219 A | 4/2018 |
| CN | 108512776 A | 9/2018 |
| KR | 100745693 B1 | 8/2007 |

OTHER PUBLICATIONS

Penghao, et al. Field-trimming Compression Model for Rule Set of Packet Classification, Journal of Electronics & Information Technology, May 2017, pp. 1185-1192, vol. 39, No. 5.
European Patent Office. Extended European Search Report for EP Application No. 20822182.0, mailed May 25, 2022, pp. 1-9.
Guo, et al. "Resistive Ternary Content Addressable Memory Systems for Data-Intensive Computing," IEEE Micro, vol. 35, No. 5, Oct. 2015, pp. 938-944.
Shi, et al. "TCAM and Multi-core Network Processor Cooperative IP Lookup Acceleration Model," Journal of Shanghai Jiao Tong University, vol. 47, No. 1, Jul. 2013, pp. 161-166.
The State Intellectual Property Office of People's Republic of China. First Office Action for CN Application No. 201910517975.4 and English translation, mailed Jun. 10, 2022, pp. 1-7.
The State Intellectual Property Office of People's Republic of China. First Search Report for CN Application No. 2019105179754 and English translation, mailed Jun. 2, 2022, pp. 1-9.
Tian, et al. "Tri-state-based partition for power reduction of TCAM," Application Research of Computers, vol. 30, No. 7, Jul. 2013, pp. 2180-2184.

* cited by examiner

MESSAGE MATCHING TABLE LOOKUP METHOD, SYSTEM, STORAGE MEDIUM, AND TERMINAL

CROSS-REFERENCE TO RELATED APPLICATION

This application is a national stage filing under 35 U.S.C. § 371 of international application number PCT/CN2020/084405, filed Apr. 13, 2020, which claims priority to Chinese patent application No. 201910517975.4, filed Jun. 14, 2019. The contents of these applications are incorporated herein by reference in their entirety.

TECHNICAL FIELD

Embodiments of the present disclosure relate to the field of Ethernet forwarding and transmission, and in particular, to a method for message match table lookup, a system, a non-transitory computer-readable storage medium and a terminal device.

BACKGROUND

In wired communication networks, such as carrier networks, switching networks or the like, a message forwarding behavior in the networks is determined by feature fields and feature flow types of messages, for example, 2-layer Media Access Control Address (MACA), Virtual Local Area Network (VLAN), 3-layer Internet Protocol (IP) address, 2.5-layer Multi-Protocol Label Switching (MPLS) label and the like.

A programmable Match-Action forwarding structure that has appeared in recent years, by collecting possible fusion of multiple feature fields and multiple conditions and then using a Ternary Content Addressable Memory (TCAM) with a large bit width and a large depth to match the fields that users are interested in, initiates a prefix lookup request, and then obtains a forwarding destination address.

The match-Action forwarding structure takes all judgment conditions and message feature field information as matched TCAM key values. Due to fragmentary key values, different bit widths and multiple condition combinations, the amount of usage of TCAMs has risen sharply, and Action RAMs corresponding to the TCAMs are also relatively large, therefore the cost and power consumption performance are not ideal.

SUMMARY

In the present disclosure a method for message match table lookup, a system, a non-transitory computer-readable storage medium and a terminal device are provided, for TCAMs and Action RAMs saving.

The method for message match table lookup provided according to an embodiment of the present disclosure may include performing on-demand data bit width compression on information of a specified part of an input message; extracting N groups of data from compressed data, performing intra-group data comparison on each of the N groups of data to obtain N groups of comparison results, and performing true value splicing on the N groups of comparison results, where N is an integer greater than 1; performing match searching of a ternary content addressable memory (TCAM) by using a true value splicing result as a keyword; and searching for an Action Random Access Memory (Action RAM) according to a match hit result of the TCAM, and outputting a table lookup request by the Action RAM.

The system for message match table lookup provided according to an embodiment of the present disclosure may include a field compression module configured to perform on-demand data bit width compression on information of a specified part of an input message; a comparison module configured to extract N groups of data from compressed data, performing intra-group data comparison on each of the N groups of data to obtain N groups of comparison results, and perform true value splicing on the N groups of comparison results, where N is an integer greater than 1; a matching module configured to perform match searching of a ternary content addressable memory (TCAM) by using a true value splicing result as a keyword; and a table lookup request module configured to search for an Action Random Access Memory (Action RAM) according to a match hit result of the TCAM, and outputting a table lookup request by the Action RAM.

According to an embodiment of the present disclosure further provided is a non-transitory computer-readable storage medium storing a computer-executable instruction. The computer-executable instruction, when executed by a processor, causes the processor to perform the method for message match table lookup described above.

According to an embodiment of the present disclosure further provided is a terminal device for message match table lookup device. The terminal device may include a memory configured to store a computer-executable instruction; and a processor configured to execute the computer-executable instruction to implement the method for message match table lookup as described above.

DETAILED DESCRIPTION

Embodiments of the present disclosure will be described below with reference to the accompanying drawings.

The steps shown in a flowchart of the drawings may be performed in a computer system, such as a set of computer-executable instructions. Moreover, although a logical order is shown in the flowchart, in some cases, the steps shown or described may be performed in a different order from that here.

Figure 1:
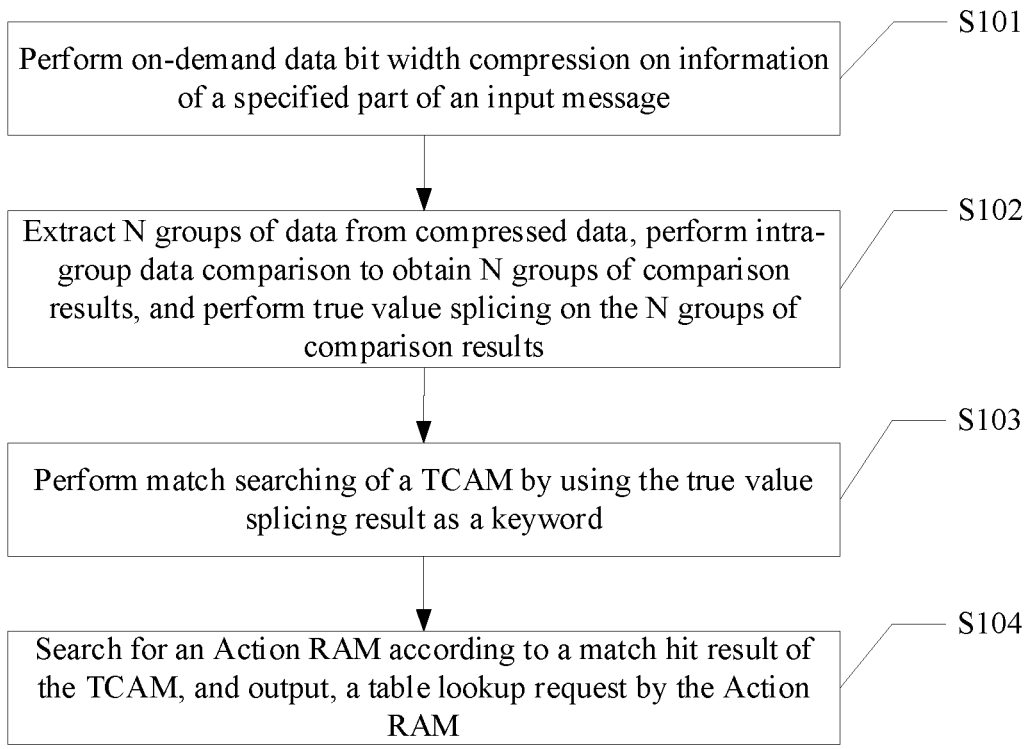
FIG. 1 is a schematic flowchart of a method for message match table lookup provided by an embodiment of the present disclosure.

According to an embodiment of the present disclosure, a method for message match table lookup, as shown in FIG. 1, includes steps S101 to S105.

At S101, on-demand data bit width compression is performed on information of a specified part of an input message.

The information of the specified part of the message may be header information or descriptor information of message attributes.

For example, the data of 3K bit are compressed into 1K bit or less in bit width, the data contain information that may be required for message match table lookup.

At S102, N groups of data are extracted from the compressed data, intra-group data comparison is performed to obtain N groups of comparison results, and true value splicing is performed on the N groups of comparison results, where N is an integer greater than 1.

Types of the comparison may include >, <, =, !=, >=, <=. The comparison result of each group is true or false. The comparison result being true means that the data in the group meet the required judgment logic, that is, the conditional judgment of IF(A) or IF(B) is met, where A and B correspond to the comparison results of different groups in this embodiment. When A or B is true, a subsequent logic is executed.

Steps S101 and S102 are a first-level matching process.

At S103, match searching of a ternary content addressable memory (TCAM) is performed by using the true value splicing result as a keyword.

At S104, according to the match hit result of the TCAM, an Action Random Access Memory (Action RAM) is searched for, and a table lookup request is output by the Action RAM.

Steps S103 and S104 are a second-level matching process.

In this embodiment, the extracting N groups of data from compressed data, performing intra-group data comparison to obtain N groups of comparison results, and performing true value splicing on the N groups of comparison results includes:

extracting the N groups of data from the compressed data, each of the N groups of data including 2 to 3 pieces of data;

performing pairwise comparison on the data in each of the N groups of data, or comparing each data in each of the N groups of data with immediate data to obtain the N groups of comparison results; and splicing the N groups of comparison results to form an N-bit true value bitmap combination, for example, merging 64 true/false into a piece of 64 bit binary data {true/false, . . . , true/false}.

In this embodiment, the performing match searching of a ternary content addressable memory (TCAM) by using a true value splicing result as a keyword includes:

performing match searching of the TCAM by using the N-bit true value bitmap combination as a keyword, where the TCAM has a depth of N*2 or N*3, and a width of the TCAM is N, which means that it supports the comparison of 2N or 3N arbitrary truth value mixtures, and supports single hit of multiple entries, the single hit of multiple entries meaning that the condition of IF (A & B & C . . . ) is met.

In this embodiment, the outputting a table lookup request by the Action RAM includes:

concurrently outputting a plurality of table lookup requests by the Action RAM, including types of the tables need to be looked up, such as hash table, direct table and acl table, and also including key value extraction principles of all types of tables; and when the plurality of table lookup requests contain the same table lookup requests, selecting one of the table lookup requests according to a priority.

In the method for message match table lookup provided in an embodiment of the present disclosure, the on-demand compression is performed on the information which may be needed for the message match table lookup, the N groups of data are extracted from the compressed data, the intra-group data comparison is performed to obtain the N groups of comparison results, realizing a subdivided condition judgment logic. By matching the true values of the conditions twice, only a small TCAM with a shallow depth and a narrow width is needed to complete the concurrent table lookup requests, and the Action RAM corresponding to the TCAM is also relatively small. Compared with the related technologies where all judgment conditions and message feature field information are taken as matched TCAM key values, the method has the advantage of saving a lot of TCAMs and Action RAMs.

The embodiment of the present disclosure will be explained with an application example below.

Figure 2:
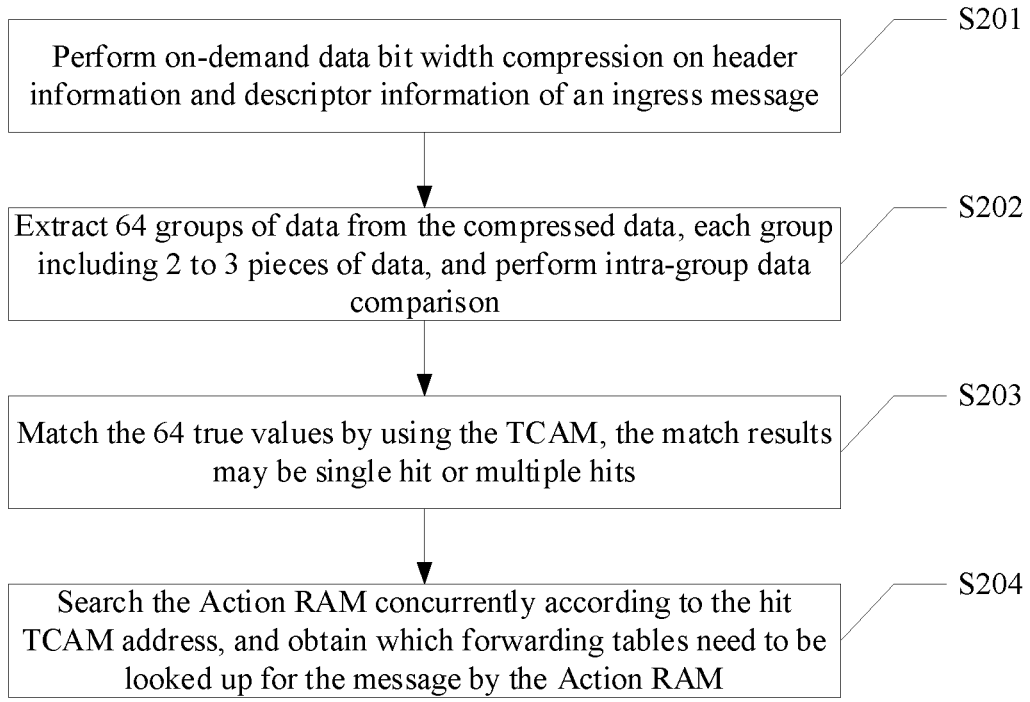
FIG. 2 is a schematic flowchart of an application example of the present disclosure using a two-level match for message match table lookup.

FIG. 2 is a schematic flowchart of an application example of the present disclosure using a two-level match for message match table lookup.

At S201, the on-demand data bit width compression is performed on header information and descriptor information of an ingress message.

At S202, 64 groups of data are extracted from the compressed data, each group including 2 to 3 data; the intra-group data comparison is performed, including >, <, =, !=, >=, <=; 64 true values after comparison are obtained, where the truth value is a binary number; the comparison result is true if the truth value is 1, and the comparison result is false if the truth value is 0.

At S203, the 64 true values are matched by using the TCAM, the match results may be single hit or multiple hits.

At S204, the Action RAM is searched concurrently according to the hit TCAM address, and which forwarding tables need to be looked for the message is obtained by the Action RAM.

Figure 3:
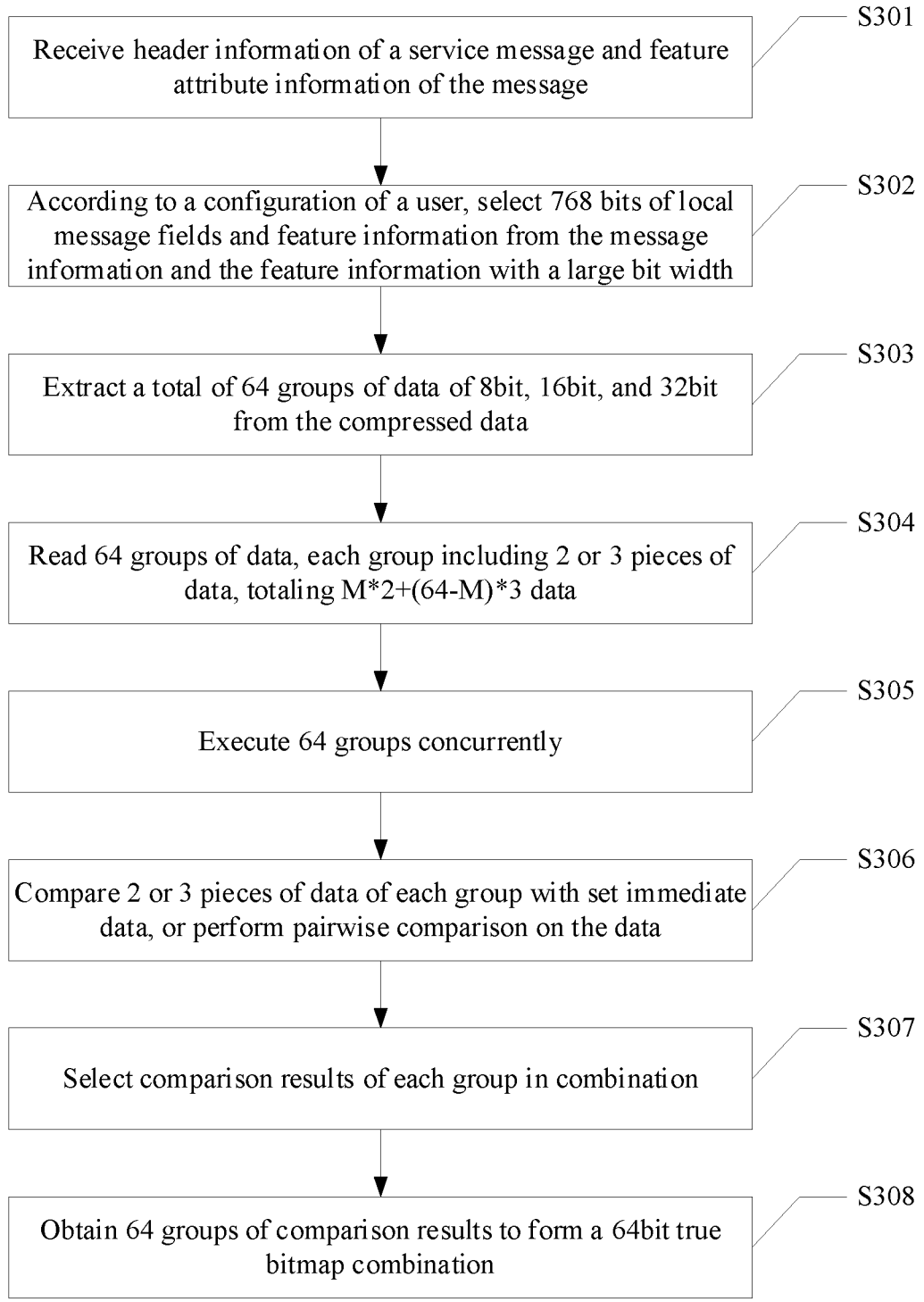
FIG. 3 is a schematic flowchart of step S201 and step S202 shown in FIG. 2.

FIG. 3 is a schematic flowchart of steps S201 and S202 shown in FIG. 2.

At S301, header information of a service message and feature attribute information of the message are received.

In a step of S302, according to a configuration of a user, 768 bits of local message field and feature information required by the user are compressed and selected from the message information and feature information with large bit width, these information are used to determine the meeting conditions of the table lookup requests.

At S303, a total of 64 groups of data of 8 bit, 16 bit, and 32 bit are extracted from the compressed data, the data of the three types of bit widths are selected in the hope that the bit widths of comparison data may be selected.

At S304, 64 groups of data are read, where each group includes 2 or 3 data, totaling M*2+(64−M)*3 data, each of the M groups contains 2 data and each of the (64−M) groups contains 3 data.

At S305, 64 groups are executed concurrently.

At S306, 2 or 3 pieces of data of each group are compared with the set immediate data, or data are compared pairwise, where the comparison logic may be >, <, =, !=, >=, <=.

At S307, comparison results of each group are selected in combination, which may be selected to meet individually, meet at the same time, or not meet at all.

At S308, 64 groups of comparison results are obtained to form a 64 bit true bitmap combination.

Figure 4:
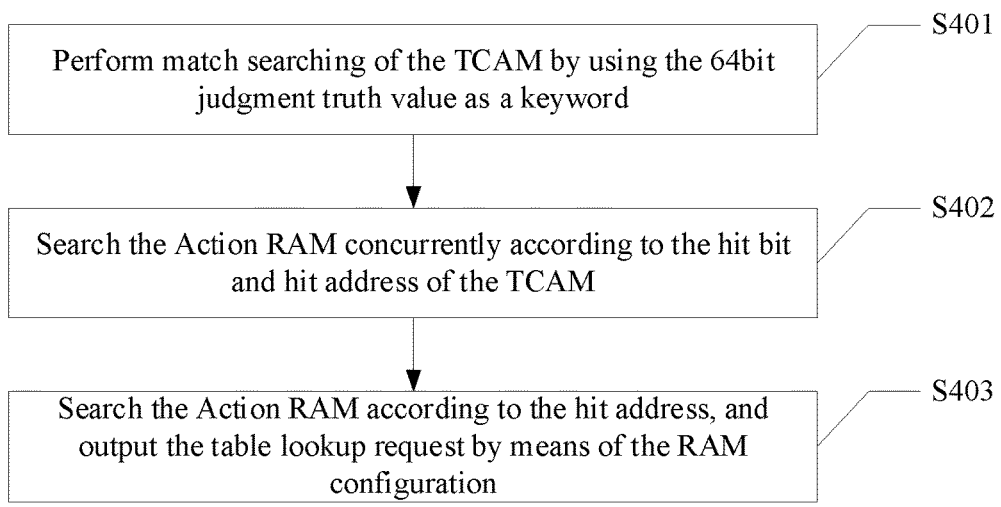
FIG. 4 is a schematic flowchart of step S203 and step S204 shown in FIG. 2.

FIG. 4 is a schematic flowchart of steps S203 and S204 shown in FIG. 2.

At S401, the match searching of the TCAM is performed by using the 64 bit judgment truth value as a keyword, where the TCAM may has a depth of N*2, N*3, N*4 or N*5, and a width of N=64; the depth is determined by N, the maximum depth may be 2^N power, and the depth value may be selected according to actual needs.

At S402, the Action RAM is searched concurrently according to the hit bit and hit address of the TCAM, that is to say, single or multiple conditions are allowed to be true, and a judgment result similar to IF(A) or IF(B) is realized.

At S403, the Action RAM is searched according to the hit address, and the table lookup request is output by means of the RAM configuration, where multiple table lookup requests may be initiated concurrently, and when the results of multiple Action RAMs have the same table lookup requests, one of the requests is selected according to the priority.

Figure 5:
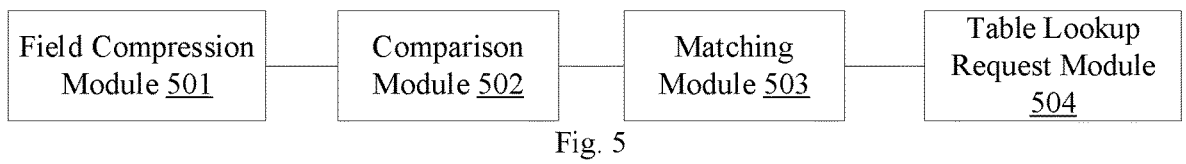
FIG. 5 is a composition diagram of a system for message match table lookup provided by an embodiment of the present disclosure.

According to an embodiment of the present disclosure further provided is a system for message match table lookup, as shown in FIG. 5, the system includes a field compression module 501, a comparison module 502, a matching module 503, and a table lookup request module 504.

The field compression module 501 is configured to perform on-demand data bit width compression on information of a specified part of an input message. The information of the specified part of the message may be header information and descriptor information of message attributes, for example, the data of 3K bit are compressed to be 1K bit or less in bit width, these data contain information that may be needed for message match table lookup;

The comparison module 502 is configured to extract N groups of data from the compressed data, perform intra-group data comparison to obtain N groups of comparison results, and perform true value splicing on the N groups of comparison results, where N is an integer greater than 1.

The comparison types include >, <, =, !=, >=, <=; the comparison result of each group is true or false, if the comparison result is true, it means that the data in the group meet the required judgment logic, that is, the conditional judgment of IF(A) or IF(B) is met, where A and B correspond to the comparison results of different groups in this embodiment; if A or B is true, the subsequent logic is executed;

The matching module 503 is configured to perform match searching of a ternary content addressable memory (TCAM) by using a true value splicing result as a keyword; and The table lookup request module 504 is configured to search for an Action Random Access Memory (Action RAM) according to a match hit result of the TCAM, and outputting a table lookup request by the Action RAM.

In the embodiment, executed by the comparison module 502, the step of extracting N groups of data from the compressed data, performing intra-group data comparison to obtain N groups of comparison results, and performing true value splicing on the N groups of comparison results, includes:
  extracting N groups of data from the compressed data, each group including 2 to 3 data;
  comparing the data in each group pairwise, or comparing all data in the group with immediate data to obtain N groups of comparison results; and
  performing true value splicing on the N groups of comparison results to form an N-bit true value bitmap combination, for example, merging 64 true/false into a piece of 64-bit binary data {true/false, ..., true/false}.

In the embodiment, executed by the matching module 503, the step of performing match searching of a ternary content addressable memory (TCAM) by using the true value splicing result as a keyword, includes:
  performing match searching of the TCAM by using the N-bit true value as a keyword, where the TCAM has a depth of N*2 or N*3, and a width of the TCAM is N, which means that it supports the comparison of 2N or 3N arbitrary truth value mixtures, and supports single hit of multiple entries, the single hit of multiple entries meaning that the condition of IF (A & B & C . . . ) is met.

In the embodiment, executed by the table lookup request module 504, the step of outputting a table lookup request by the Action RAM, includes:
  concurrently outputting a plurality of table lookup requests by the Action RAM, including which types of tables need to be looked up, such as hash table, direct table and acl table, and also including key value extraction principles of all types of tables; and
  when the plurality of table lookup requests contain the same table lookup requests, selecting one of the table lookup requests according to the priority.

According to the system for message match table lookup provided by an embodiment of the present disclosure, the on-demand compression is performed on the information which may be needed for the message match table lookup, N groups of data are extracted from the compressed data, and the intra-group data comparison is performed to obtain N groups of comparison results, thereby realizing a subdivided condition judgment logic. By matching the true values of the conditions twice, only a small TCAM with a shallow depth and a narrow width is needed to complete the concurrent table lookup requests, and the Action RAM corresponding to the TCAM is also relatively small. Compared with the related technology which takes all judgment conditions and message feature field information as matched TCAM key values, the system has the advantage of saving a lot of TCAMs and Action RAMs.

According to an embodiment of the present disclosure further provided is a non-transitory computer-readable storage medium. The non-transitory computer-readable storage medium stores a computer-executable instruction, which, when executed by a processor, causes the processor to perform the method for message match table lookup as described in the abovementioned embodiments.

According an embodiment of the present disclosure further provided is a terminal device for message match table lookup. The terminal device includes a memory configured to store a computer-executable instruction, and a processor configured to execute the computer-executable instruction to implement the method for message match table lookup as described in the abovementioned embodiments.

All or some of the steps, systems and functional modules/units in the devices disclosed above may be implemented as software, firmware, hardware and appropriate combinations thereof. In the hardware implementation, the division between functional modules/units mentioned in the above description does not necessarily correspond to the division of physical components. For example, a physical component may have multiple functions, or a function or a step may be cooperatively performed by multiple physical components. Some or all of the components may be implemented as software executed by a processor, such as a digital signal processor or a microprocessor, or as hardware, or as an integrated circuit, such as an application specific integrated circuit. Such software may be distributed on a computer-readable medium, and the computer-readable medium may include a computer storage medium (or a non-transitory medium) and a communication medium (or a transitory medium). The computer storage medium includes volatile and nonvolatile, removable and non-removable media implemented in any method or technology for storing information such as computer-readable instructions, data structures, program modules or other data. The computer storage medium includes Random Access Memories (RAMs), Read-Only Memories (ROMs), Electrically Erasable Programmable Read-Only Memories (EEPROMs), flash memories or other memory technologies, portable Compact Disc Read Only Memories (CD-ROMs), Digital Video Disks (DVDs) or other CD memories, magnetic cassettes, magnetic tapes, disk memories or other magnetic storage devices or any other medium that may be used to store desired information and may be accessed by a computer. The communication medium may generally include computer-readable instructions, data structures, program modules or other data in a modulated data signal such as a carrier wave or other transmission mechanism, and may include any information delivery medium.

The invention claimed is:

1. A method for message match table lookup, comprising:
   performing on-demand data bit width compression on information of a specified part of an input message;
   extracting N groups of data from compressed data, performing intra-group data comparison on each of the N groups of data to obtain N groups of comparison results, and performing true value splicing on the N groups of comparison results, wherein N is an integer greater than 1;
   performing match searching of a Ternary Content Addressable Memory, TCAM, by using a true value splicing result as a keyword; and
   searching for an Action Random Access Memory, Action RAM, according to a match hit result of the TCAM, and outputting a table lookup request by the Action RAM;
   wherein, extracting N groups of data from compressed data, performing intra-group data comparison on each of the N groups of data to obtain N groups of comparison results, and performing true value splicing on the N groups of comparison results, comprises:
   extracting the N groups of data from the compressed data, each of the N groups of data comprising 2 to 3 data;
   performing pairwise comparison on the data in each of the N groups of data, or comparing each data in each of the N groups of data with immediate data to obtain the N groups of comparison results; and
   performing the true value splicing on the N groups of comparison results to form an N-bit true value bitmap combination;
   wherein, performing match searching of a TCAM by using a true value splicing result as a keyword, comprises:
   performing the match searching of the TCAM by taking the N-bit true value bitmap combination as a keyword, wherein the TCAM has a depth of N*2 or N*3, and a width of N.

2. The method for message match table lookup of claim 1, wherein, outputting a table lookup request by the Action RAM, comprises:
   concurrently outputting, by the Action RAM, a plurality of table lookup requests; and
   selecting, in response to the plurality of table lookup requests containing the same table lookup requests, one of the table lookup requests according to a priority.

3. A non-transitory computer-readable storage medium storing a computer-executable instruction which, when executed by a processor, causes the processor to perform a method for message match table lookup comprising:
   performing on-demand data bit width compression on information of a specified part of an input message;
   extracting N groups of data from compressed data, performing intra-group data comparison on each of the N groups of data to obtain N groups of comparison results, and performing true value splicing on the N groups of comparison results, wherein N is an integer greater than 1;
   performing match searching of a Ternary Content Addressable Memory, TCAM, by using a true value splicing result as a keyword; and
   searching for an Action Random Access Memory, Action RAM, according to a match hit result of the TCAM, and outputting a table lookup request by the Action RAM;
   wherein, extracting N groups of data from compressed data, performing intra-group data comparison on each of the N groups of data to obtain N groups of comparison results, and performing true value splicing on the N groups of comparison results, comprises:
   extracting the N groups of data from the compressed data, each of the N groups of data comprising 2 to 3 data;
   performing pairwise comparison on the data in each of the N groups of data, or comparing each data in each of the N groups of data with immediate data to obtain the N groups of comparison results; and
   performing the true value splicing on the N groups of comparison results to form an N-bit true value bitmap combination;
   wherein, performing match searching of a TCAM by using a true value splicing result as a keyword, comprises:
   performing the match searching of the TCAM by taking the N-bit true value bitmap combination as a keyword, wherein the TCAM has a depth of N*2 or N*3, and a width of N.

4. A terminal device for message match table lookup, comprising:
   a memory configured to store a computer-executable instruction; and
   a processor configured to execute the computer-executable instruction to perform a method for message match table lookup comprising:
   performing on-demand data bit width compression on information of a specified part of an input message;
   extracting N groups of data from compressed data, performing intra-group data comparison on each of the N groups of data to obtain N groups of comparison results, and performing true value splicing on the N groups of comparison results, wherein N is an integer greater than 1;
   performing match searching of a Ternary Content Addressable Memory, TCAM, by using a true value splicing result as a keyword; and
   searching for an Action Random Access Memory, Action RAM, according to a match hit result of the TCAM, and outputting a table lookup request by the Action RAM;
   wherein, extracting N groups of data from compressed data, performing intra-group data comparison on each of the N groups of data to obtain N groups of comparison results, and performing true value splicing on the N groups of comparison results, comprises:

extracting the N groups of data from the compressed data, each of the N groups of data comprising 2 to 3 data;
performing pairwise comparison on the data in each of the N groups of data, or comparing each data in each of the N groups of data with immediate data to obtain the N groups of comparison results; and
performing the true value splicing on the N groups of comparison results to form an N-bit true value bitmap combination;
wherein, performing match searching of a TCAM by using a true value splicing result as a keyword, comprises:
performing the match searching of the TCAM by taking the N-bit true value bitmap combination as a keyword, wherein the TCAM has a depth of N*2 or N*3, and a width of N.

5. The terminal device of claim 4, wherein, outputting a table lookup request by the Action RAM, comprises:
concurrently outputting, by the Action RAM, a plurality of table lookup requests; and
selecting, in response to the plurality of table lookup requests containing the same table lookup requests, one of the table lookup requests according to a priority.

* * * * *